United States Patent [19]

Harada et al.

[11] Patent Number: 4,518,868
[45] Date of Patent: May 21, 1985

[54] SUPERCONDUCTIVE LARGE-SCALE INTEGRATED CIRCUIT CHIP

[75] Inventors: Yutaka Harada, Kodaira; Kunio Yamashita, Hachioji; Nobuo Kotera, Kokubunji; Hirotoshi Tanaka, Hachioji, all of Japan

[73] Assignee: Hitachi, Ltd., Tokyo, Japan

[21] Appl. No.: 278,730

[22] Filed: Jun. 29, 1981

[30] Foreign Application Priority Data

Jun. 27, 1980 [JP] Japan .................... 55-86622

[51] Int. Cl.³ .......................................... H03K 19/195
[52] U.S. Cl. .................... 307/306; 307/476; 357/5
[58] Field of Search ............... 307/303, 306, 462, 476; 357/5

[56] References Cited

U.S. PATENT DOCUMENTS

| | | | |
|---|---|---|---|
| 3,758,795 | 9/1973 | Anacker et al. | 357/5 |
| 3,868,515 | 2/1975 | Landman | 307/306 |
| 4,012,646 | 3/1977 | Fang et al. | 357/5 |

Primary Examiner—John Zazworsky
Attorney, Agent, or Firm—Antonelli, Terry & Wands

[57] ABSTRACT

A superconductive large-scale integrated circuit chip comprises a plurality of pads, a superconductive line which short-circuits respectively adjacent pairs of the pads, and an input buffer circuit. The input buffer circuit includes a Josephson junction which is either in a superconducting state or a finite voltage state in response to a magnetic field established by current that is supplied to the superconductive line by flowing in from one of the two pads and flowing out from the other pad. The input buffer circuit wave-shapes the externally supplied signal into an amplitude-controlled signal, and the latter signal is led by a superconductive line to a circuit within the chip which requires the signal. Even when the external signal current has become abnormally great due to noise, etc., any circuit situated halfway within the chip can be prevented from malfunctioning from the magnetic flux generated by the large current.

2 Claims, 5 Drawing Figures

SUPERCONDUCTIVE LARGE-SCALE INTEGRATED CIRCUIT CHIP

BACKGROUND OF THE INVENTION

This invention relates to a large-scale integrated circuit (hereinbelow, termed "LSI") chip which includes superconductive devices. In particular, this invention relates to devices having Josephson junction (hereinbelow, termed "Josephson device").

In the past, in LSI chip including Josephson devices, experiments on the delay time have been performed (e.g. see H. C. Jones, D. J. Herrel, "The Characteristics of Chip-to-Chip Signal Propagation in a Package Suitable for Superconducting Circuits", IBM Journal of Research and Development, Volume 24, Number 2, pages 172–177, March 1980). As shown in FIG. 1, the LSI chip used in this prior experiment was provided with a drain connector 10 on one side (e.g., the left side) of the chip 1 and a source connector 12 on another side (e.g., the upper side). Both of the connectors are connected by a superconductive line 11 which is disposed within the chip. An external input signal is applied to the superconductive line 11 through the drain connector 10, and an output is delivered from the source connector 12.

Frequently, in such an arrangement as shown in FIG. 1, the input signal is affected by noise on a transmission line outside the LSI chip. Accordingly, when the superconductive line 11 to which the input signal is applied in long, circuitry within the LSI chip is liable to experience adverse effects. Therefore, the superconductive line 11 needs to be shortened. When, as in the LSI chip 1 of the aforementioned experiment, the superconductive line is laid from one side to another side of the LSI chip, such a superconductive line can be shortened only at the four corners of the chip 1. Unfortunately, this poses a problem in the layout. In the presence of five or more pairs of source connectors and drain connectors, generally one or more superconductive lines cannot be shortened. In addition, it becomes difficult to design the layout so that the output line of an input buffer which is magnetically coupled with the superconductive line does not intersect with this superconductive line.

SUMMARY OF THE INVENTION

This invention has been made in order to solve the problems of the prior art described above, and has for its object to provide a LSI chip which is less susceptible to the influence of noise involved in an external input signal.

In order to accomplish this and other objects, according to a superconductive large-scale integrated circuit chip of this invention, a superconductive line to which an external input signal is applied is not directly interconnected with a specified portion within the chip requiring the signal. Instead, the input signal is wave-shaped by a switching circuit including a Josephson junction magnetically coupled with the superconductive line. The wave-shaped signal is led to the specified portion within the chip by a superconductive line. This permits the interconnection within the chip of the superconductive line to which the external input signal is directly applied to be significantly shortened. In other words, a superconductive large-scale integrated circuit chip is provided with a plurality of pads along at least one of its peripheral edges. Superconductive lines for short-circuiting pairs of adjacent pads are provided. In addition, an input buffer circuit is provided including a Josephson junction which either in a superconducting state or in a finite voltage state in response to a magnetic field established by current externally supplied to the superconductive line, which current flows in from one pad of the pad pair and flows out of the other pad.

DETAILED DESCRIPTION OF THE PREFERRED EMBODIMENT

Figure 1:
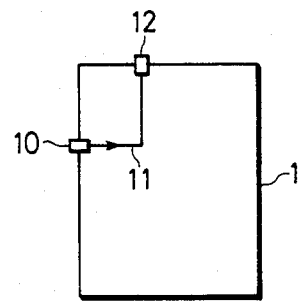
FIG. 1 is a schematic constructional view of a prior-art superconductive LSI chip.
Figure 2:
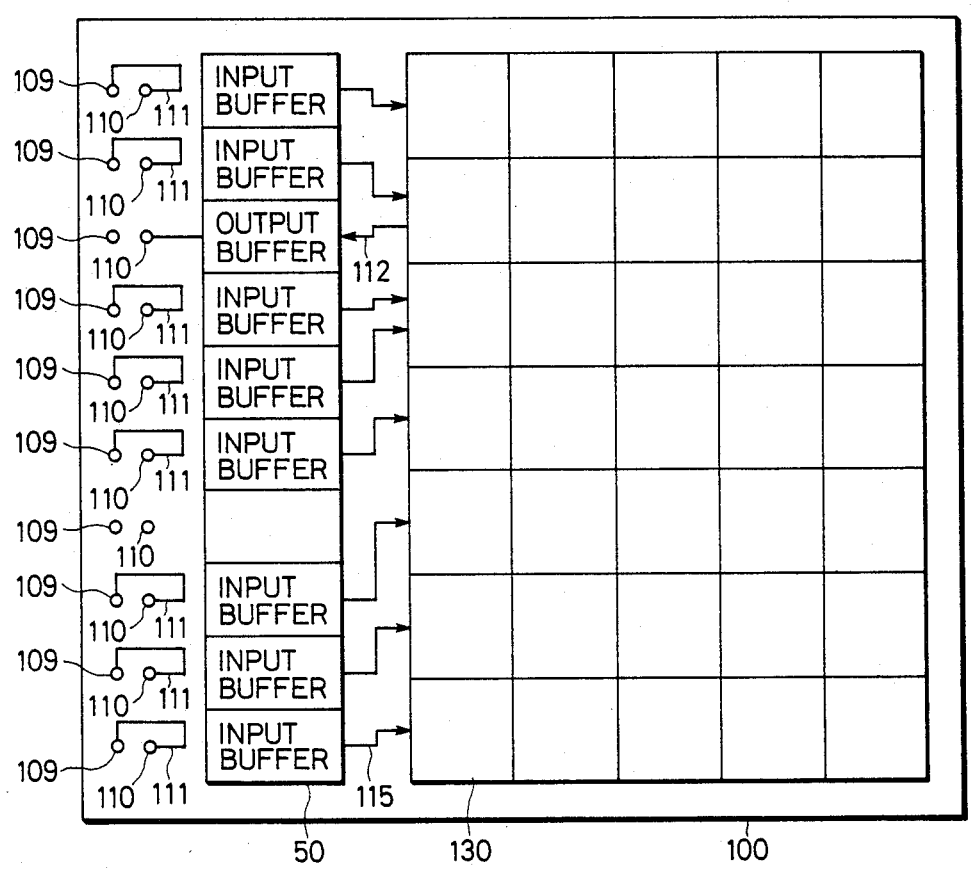
FIG. 2 is a general schematic constructional view and FIG. 3 is a partial expanded view of a superconductive LSI chip which is an embodiment of this invention, respectively.
Figure 4:
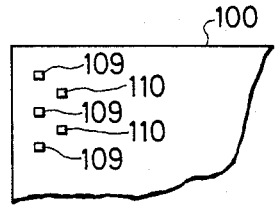
FIG. 4 is an arrangement view of pads on the chip.

FIG. 2 is a schematic arrangement diagram of an LSI chip 100 embodying this invention. A plurality of drain pads 109 and source pads 110 are arrayed on the left side of the chip 100 in two columns regularly at fixed intervals. The drain pads of the first column and the corresponding source pads of the second column are arranged in the same row positions. The pads, however, may, if desired, be arranged into the so-called zigzag arrangement by staggering the pad positions of the first column and the second column as shown in FIG. 4.

The respectively adjacent ones of the drain pads 109 and the source pads 110 constitute pairs. Numeral 130 designates a cell area in which a memory cell, a gate cell or the like is formed. Numeral 50 designates a group of buffer areas which are provided between the plurality of pad pairs and the plurality of cell areas, in correspondence with the respective pad pairs so that a buffer is provided for each pad pair along which an input or output is to pass. An input or output buffer circuit is disposed in the buffer area. Numeral 111 indicated a superconductive line.

Figure 3:
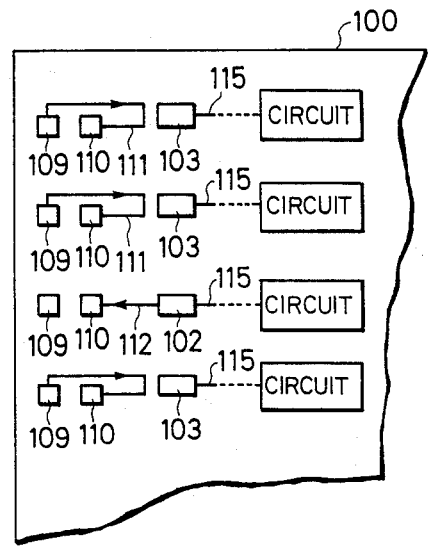

FIG. 3 is an expanded view of a part in FIG. 2. As shown in the figure, either an input buffer circuit 103 or an output buffer circuit 102 constructed of a switching circuit is disposed in correspondence with each pad pair. The paired drain pad 109 and source pad 110 for the input buffer circuit 103 and connected by the looped superconductive line 111. The superconductive line 111 is magnetically coupled with the input buffer circuit 103, and the input buffer circuit 103 is driven by an input signal flowing through the superconductive line 111. The input signal of the superconductive line 111 is wave-shaped by the input buffer circuit 103, and is applied through a superconductive line 115 to that gate or memory within the cell area which is to be driven by the input signal.

An output of the output buffer circuit 102 is delieved through an output line 112 to the source pad 110 of the pad pair corresponding to this circuit 102. Nothing connected to the drain pad 109 corresponding to this circuit 102. In FIG. 2, a pad which is connected to the ground are omitted from the illustration.

Although, in the above embodiment, the plurality of pad pairs have been disposed on one side of the LSI chip, they may, of course, also be disposed on other sides of the chip. Also, although the pad 109 corresponding to the output buffer circuit 102 is shown as electrically floating, this pad 109 may be connected with the pad 110 so as to derive the output of the circuit 102 from the pad 109 if desired. In addition, although the input buffer circuit functions to wave-shape the input signal and then transmit it to the circuit of the cell area, other types of circuits could be used if desired as long as it transmits a signal in phase with or in antiphase to the input signal. It is also permissible to bring the gate circuits which are among the circuits within the cell areas into the buffer areas to be used as the input buffer circuits. Further, although the superconductive line 111 has been shown in the single-loop shape, it may also be formed in a multiple-loop shape in order to intensify a magnetic flux which is to be applied to the input buffer circuit.

Owing to the construction as stated above, the following effects are brought forth:

(1) Each of the interconnections 111 of the superconductive lines which connect the paired pads corresponding to the input buffer circuits can be shortened even when the number of the interconnections has increased. It is therefore possible to avoid the magnetic coupling between the interconnection 111 and the interconnection of the cell area within the LSI chip or the device having the Josephson junction, so that even when noise is included in the input signal applied to the interconnection 111, the circuit of the cell area can be prevented from malfunctioning due to the noise. Even when a high current noise is included in the input signal, this input signal is wave-shaped (clamped) by the input buffer circuit and then applied through the superconductive line 115. Therefore, a high current does not flow through the superconductive line 115 on account of the noise. Therefore, the noise does not affect the halfway cell area or areas located on the side of the circuit within the predetermined cell area to which the input signal is applied.

(2) Since the adjacent pads are interconnected, an intersection between the interconnections can be avoided. Therefore, the interconnection between the output line of the input buffer circuit and the interconnection can be avoided, so that any malfunction attributed to the mutual induction between the lines is preventable.

(3) In case of modifying the circuitry within the chip, the layout of the interconnections may be changed without changing the layout of the pads, and a mask for the pads need not be designed and fabricated for each modification.

(4) Since the pad pairs and the buffer areas are in 1-to-1 correspondence, the design is easy and an erroneous interconnection is unlikely to occur. When a certain pad pair is not used for an input or output operation, nothing need to be disposed in the buffer area corresponding thereto.

Figure 5:
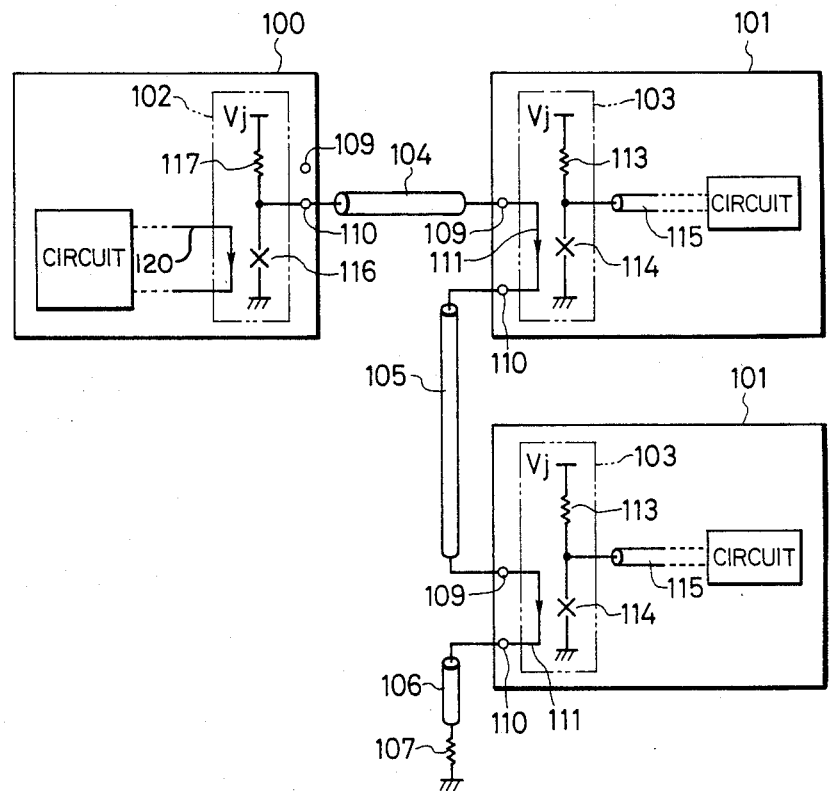
FIG. 5 is a diagram of the wiring amoung superconductive LSI chips of this invention.

FIG. 5 is a wiring diagram for applying one chip output to a plurality of chips, for example, a first LSI chip and a second LSI chip as shown. In order to transmit a signal from the LSI chip 100 to the plurality of LSI chips 101, the output of the output buffer circuit 102 of the LSI chip 100 which consists of a resistor 117 and a Josephson device 116 is connected to one end of a transmission line 104 through the pad 110. The other end of the transmission line 104 is magnetically coupled with the input buffer circuit 103 within the first LSI chip 101 through the signal pad 109 and the superconductive line 111 of the LSI chip 101, and is further connected to one end of another transmission line 105 through the pad 110 of the first LSI chip 101. The other end of the transmission line 105 is magnetically coupled with the input buffer circuit 103 within the last or second LSI chip 101 through the pad 109 and the superconductive line 111, and is further connected to one end of a transmission line 106 through the pad 110. The other end of the transmission line 106 is grounded through a terminating resistor 107 which is disposed outside the LSI chip. The output of the input buffer circuit 103 within each LSI chip 101 is connected to the transmission line 115 which transmits the signal into the LSI chip. The buffer circuit 103 within the LSI chip 101 is exemplified as being constructed of a resistor 113 and a Josephson device 114 connected in series.

The Josephson devices 114 is magnetically coupled with the superconductive line 111. In the absence of current flowing through the line 111, the superconductive device 114 is in a superconducting state, the potential of the output line 115 of the input buffer circuit 103 becomes 0 (zero), and no current flows through the output line 115. On the other hand, in the presence of the current flow through the line 111, the superconductive device 114 goes into a voltage state due to a magnetic field induced by this current, and current flows through the output line 115. Symbol Vj indicates a supply voltage. The output buffer 102 operates in a similar manner by providing a switching function using the Josephson device 116 to control the output of the circuit 100 in accordance with an internal superconductive line 120 magnetically coupled to the Josephson device 116.

In this manner, the input buffer circuit 103 may be the switching circuit which operates by sensing the current level of the input signal flowing through the line 111. Similarly, output buffer 102 operates by sensing the current level of the line 120. It should also be noted that the circuit arrangement could also operate to provide a switching function even when the resistors 113 and 117 are replaced with Josephson devices.

Although, in the above embodiment, the wiring of the LSI chips is made by the use of the transmission lines 104, 105 and 106, it may well be made by utilizing a multilayer wiring board on which the LSI chips are bonded by a controlled collapse bonding process.

Since the terminating resistor 107 is disposed outside the LSI chips, heat generated by the flow of current through the terminating resistor 107 can be prevented from having influence on the superconductive LSI chips.

Owing to this construction wherein the terminating resistor 107 is not disposed within the LSI chip and wherein the input signal passes immediately through the LSI chip as soon as it enters thereinto (i.e. from pad 109, through superconductive line 111, and pad 110), the input signal which is the output of one chip can be readily transmitted to a plurality of chips. Thus, the signal transmission from one chip to a plurality of chips is greatly facilitated.

In the invention, it is significant in a number of ways that the terminating resistor 107 is not disposed within the LSI chip. For example if, among the LSI chips connected in series, the last connected LSI chip is provided with the terminating resistor therein, it becomes structurally different from the halfway LSI chips having no terminating resistor, an the LSI chip within terminating resistor must be heavily used. In addition, the user needs to distinguish the LSI chip with the terminating resistor and the LSI chip without the terminating resistor in using the LSI chips. This is troublesome. Further, a plurality of signal lines are generally provided between the LSI chips, and it is difficult to arrange the circuit so that all the terminating resistors can always be assembled in the single LSI chip. In view of such facts, the disposition of the terminating resistor outside the LSI chips permits the LSI chips to be connected both halfway and at the end. This makes the arrangement quite suitable for mass production, as well as being easy to use because the constructions of the input portions which consist of the pads 109 and 110 and the superconductive line 111 can be unified.

Further, since the pad pairs and the buffer areas are determined and designed in advance, the layout configuration is very simple.

As set forth above, according to this invention, the input buffer circuit of the LSI 101 is arranged near the pads 109 and 110, so that the superconductive line 111 for interconnecting the LSI chips need not extend from one side of the LSI chip to another side of it. As a result, interconnections within the LSI chip are facilitated, and simultaneously, noise picked up by the signal lines 104, 105 etc. outside the LSI chip will have less of an effect on circuitry within the LSI chip. Moreover, by pairing the two pads in advance, the structures of the input and output buffer circuits and patterns of the LSI chip become easy to standarize. This is very convenient for realizing a master slice LSI.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A combination of a plurality of superconductive large-scale integrated circuit chips, each comprising:
   a plurality of conductive pads which are disposed along at least one of peripheral edges of said chip;
   an input superconductive line which short-circuits a pair of said plurality of pads;
   an input buffer magnetically coupled to said input superconductive line, said input buffer including a Josephson device which operates in a superconductive state when no current flows through said input superconductive line and in a voltage state when current flows through the input superconductive line, wherein said input buffer further comprises means coupled between the Josephson device and a predetermined circuit in the chip for controlling the application of current to said predetermined circuit in accordance with the state of operation of the Josephson device;
   an output superconductive line with the chip coupled to receive an output from the predetermined circuit within the chip so that current flows in said output superconductive line when the predetermined circuit produces an output;
   an output buffer magnetically coupled to the output superconductive line, wherein the output buffer includes a Josephson device which operates in a superconductive state when no current flows through the output superconductive line and in a voltage state when the current flows through the output superconductive line,
   wherein an output buffer at least one of said superconductive chips is coupled in series to input superconductive lines of at least two other superconductive chips.

2. A superconductive large-scale integrated circuit chip according to claim 1, wherein a terminating resistor is connected in series with the series connection of the input superconductive lines of said at least two other superconductive chips, said terminating resistor being located outside of the superconductive chips to which it is connected.

* * * * *